United States Patent
Wu

(10) Patent No.: US 9,442,334 B2
(45) Date of Patent: Sep. 13, 2016

(54) ARRAY SUBSTRATE AND LIQUID CRYSTAL DISPLAY PANEL

(71) Applicant: SHENZHEN CHINA STAR OPTOELECTRONICS TECHNOLOGY CO., LTD., Shenzhen, Guangdong (CN)

(72) Inventor: Yuzhi Wu, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 37 days.

(21) Appl. No.: 14/418,339

(22) PCT Filed: Dec. 19, 2014

(86) PCT No.: PCT/CN2014/094301
§ 371 (c)(1),
(2) Date: Jan. 29, 2015

(87) PCT Pub. No.: WO2016/090669
PCT Pub. Date: Jun. 16, 2016

(65) Prior Publication Data
US 2016/0170255 A1    Jun. 16, 2016

(30) Foreign Application Priority Data
Dec. 12, 2014 (CN) .......................... 2014 1 0766994

(51) Int. Cl.
G02F 1/13      (2006.01)
G02F 1/1343    (2006.01)
H01L 27/12     (2006.01)
G02F 1/1362    (2006.01)
G02B 27/01     (2006.01)

(52) U.S. Cl.
CPC ....... *G02F 1/13439* (2013.01); *G02B 27/0172* (2013.01); *G02F 1/134309* (2013.01); *G02F 1/136286* (2013.01); *H01L 27/124* (2013.01); *H01L 27/1218* (2013.01); *G02B 2027/0178* (2013.01)

(58) Field of Classification Search
CPC .......... G02B 27/22; G02B 2027/0178; G02B 27/0172; G02B 27/02
See application file for complete search history.

(56) References Cited

U.S. PATENT DOCUMENTS

2012/0026161 A1\* 2/2012 Chen .................. G02B 5/06
345/419

\* cited by examiner

*Primary Examiner* — Phu Vu
(74) *Attorney, Agent, or Firm* — Muncy, Geissler, Olds & Lowe PC

(57) ABSTRACT

The present invention proposes an array substrate includes two or more pixel structure areas formed by different lenses, with each pixel structure area comprising a plurality of sub-areas, and each sub-area comprising a plurality of pixel structures. Since pixel structures in the sub-areas next to a junction of two pixel structure areas are distributed based on density, a brightness of sub-areas next to the junction can be displayed in uniformity.

19 Claims, 6 Drawing Sheets

ARRAY SUBSTRATE AND LIQUID CRYSTAL DISPLAY PANEL

BACKGROUND OF THE INVENTION

1. Field of the Invention

The present invention relates to liquid crystal display (LCD) devices, and more specifically, to an array substrate and LCD display panel.

2. Description of the Prior Art

As the society evolves, LCD devices are becoming the mainstream, more important than other display devices. Conventional LCD devices have various different display modes, such as vertical alignment (VA), in-plane switching (IPS), and fringe field switching (FFS).

In order to have a wider viewing angle, each pixel of a LCD panel is installed with multiple display domains, and each display domain has pixel electrodes forming bulges and slits that extend to different directions.

However, when making the abovementioned pixel electrodes, different lenses must be utilized to undertake graphical processing of the pixel electrodes. This will lead to changes of line width of pixel electrodes locating correspondingly on the rim of the lenses, making the brightness uniformity of pixels at the rim of the lenses poorer. The display quality of a LCD device is affected given that the closer to the rim of the lenses, the poorer the brightness is.

Therefore, it is necessary to provide an array substrate and LCD panel to solve the existing technical problem.

SUMMARY OF THE INVENTION

An object of the present invention is to provide an array substrate and LCD panel that guarantees higher brightness uniformity, so to solve the technical problem of poorer display brightness uniformity of pixels at the rim of lenses.

According to the present invention, an array substrate comprises a plurality of data lines, a plurality of scan lines and a plurality of pixel structures with pixel electrodes. The plurality of pixel structure are formed in areas surrounded by the plurality of date lines and the plurality of scan lines. The array substrate comprises two or more pixel structure areas formed by different lenses, with each pixel structure area comprising a plurality of sub-areas, and each sub-area comprising a plurality of pixel structures. The plurality of pixel structures in the plurality of sub-areas next to a junction of two pixel structure areas are distributed based on density. An amount of pixel structures is more in zones close to the junction, and less in zones away from the junction. The pixel structures in the sub-areas next to the junction of the two pixel structure areas comprise pixel electrodes of various line widths. The pixel structures have a plurality of display domains, with the pixel electrodes of each domain extending towards different directions.

In one aspect of the present invention, the pixel structures in the sub-areas next to the junction of two pixel structure areas further comprise deformed pixel electrodes.

In another aspect of the present invention, the deformed pixel electrodes comprise pixel electrodes having bulges.

In still another aspect of the present invention, the deformed pixel electrodes comprise pixel electrodes having dents and bulges.

In yet another aspect of the present invention, the deformed pixel electrodes comprise pixel electrodes having openings.

According to the present invention, an array substrate comprises a plurality of data lines, a plurality of scan lines and a plurality of pixel structures with pixel electrodes. The plurality of pixel structure are formed in areas surrounded by the plurality of date lines and the plurality of scan lines. The array substrate comprises two or more pixel structure areas formed by different lenses, with each pixel structure area comprising a plurality of sub-areas, and each sub-area comprising a plurality of pixel structures. The plurality of pixel structures in the plurality of sub-areas next to a junction of two pixel structure areas are distributed based on density. An amount of pixel structures is more in zones close to the junction, and less in zones away from the junction.

In one aspect of the present invention, the pixel structures in the sub-areas next to the junction of the two pixel structure areas comprise pixel electrodes of various line widths.

In another aspect of the present invention, the pixel structures in the sub-areas next to the junction of two pixel structure areas further comprise deformed pixel electrodes.

In another aspect of the present invention, the deformed pixel electrodes comprise pixel electrodes having bulges.

In another aspect of the present invention, the deformed pixel electrodes comprise pixel electrodes having dents and bulges.

In still another aspect of the present invention, the deformed pixel electrodes comprise pixel electrodes having openings.

In yet another aspect of the present invention, the pixel structures comprises a plurality of display domains, with the pixel electrodes of each domain extending towards different directions.

According to the present invention, a liquid crystal display panel comprises an array substrate, a cell substrate, and a liquid crystal layer therebetween. The array substrate comprises a plurality of data lines, a plurality of scan lines and a plurality of pixel structures with pixel electrodes. The plurality of pixel structure are formed in areas surrounded by the plurality of date lines and the plurality of scan lines. The array substrate comprises two or more pixel structure areas formed by different lenses, with each pixel structure area comprising a plurality of sub-areas, and each sub-area comprising a plurality of pixel structures. The plurality of pixel structures in the plurality of sub-areas next to a junction of two pixel structure areas are distributed based on density. An amount of pixel structures is more in zones close to the junction, and less in zones away from the junction.

In one aspect of the present invention, the pixel structures in the sub-areas next to the junction of the two pixel structure areas comprise pixel electrodes of various line widths.

In another aspect of the present invention, the pixel structures in the sub-areas next to the junction of two pixel structure areas further comprise deformed pixel electrodes.

In another aspect of the present invention, the deformed pixel electrodes comprise pixel electrodes having bulges.

In another aspect of the present invention, the deformed pixel electrodes comprise pixel electrodes having dents and bulges.

In still another aspect of the present invention, the deformed pixel electrodes comprise pixel electrodes having openings.

In yet another aspect of the present invention, the pixel structures comprises a plurality of display domains, with the pixel electrodes of each domain extending towards different directions.

Comparing to conventional array substrates and LCD panels, the present invention distributes pixel structures next to a junction of two pixel areas based on density. Thus the brightness of a sub-area next to the junction of two pixel areas can be displayed in uniformity, solving the technical problem of poorer display brightness uniformity of pixels at the edge of lenses.

These and other features, aspects and advantages of the present disclosure will become understood with reference to the following description, appended claims and accompanying figures.

DETAILED DESCRIPTION OF PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It is noted that the same components are labeled by the same number.

Figure 1:
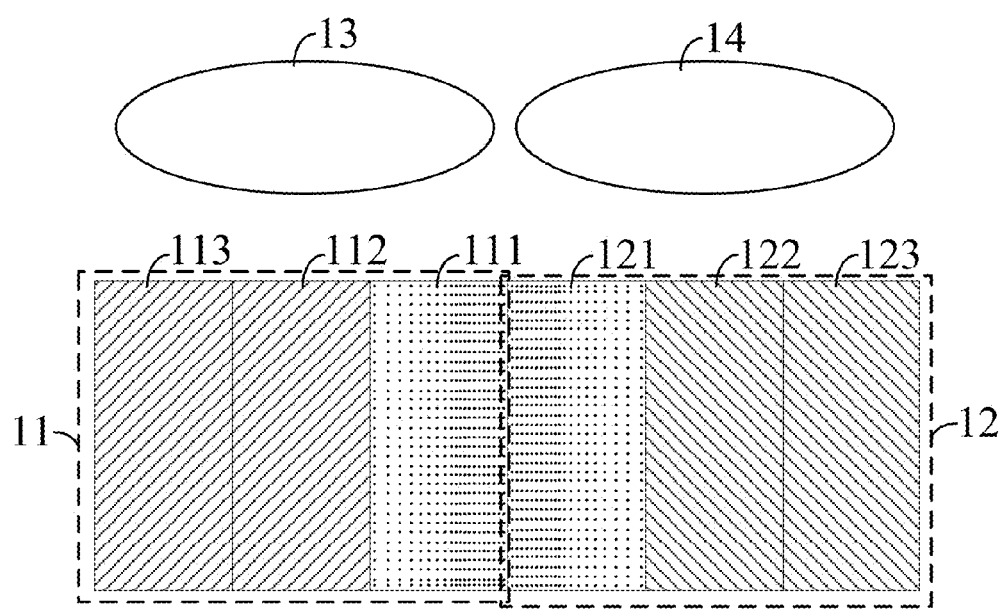
FIG. 1 shows a pixel structure diagram of an array substrate according to a first preferred embodiment of the present invention.

Please refer to FIG. 1 showing a pixel structure diagram of an array substrate according to a first preferred embodiment of the present invention. The array substrate of the preferred embodiment comprises a plurality of data lines, a plurality of scan lines and a plurality of pixel structures with pixel electrodes formed by crossed data lines and scan lines. The array substrate comprises two or more pixel structure areas formed by different lenses, and each pixel structure area comprises a plurality of sub-areas, each having a plurality of pixel structures. The pixel structures in the sub-areas next to the junction of two pixel areas are distributed based on density, which means that the amount of pixel structures is more in zones near the junction, and less in zones away from the junction.

Please refer to FIG. 1. The array substrate comprises a pixel structure area 11 and a pixel structure area 12. The pixel structure area 11 comprises a sub-area 111, a sub-area 112, and a sub-area 113. The pixel structure area 12 comprises a sub-area 121, a sub-area 122, and a sub-area 123. The pixel structure area 11 is patterned through lens 13 and forms the pixel structures on the surface. The pixel structure area 12 is patterned through lens 14 and forms the pixel structures on the surface. The sub-area 111 of the pixel structure area 11 locates on one side of the junction between the pixel structure areas 11 and 12, and the sub-area 121 of the pixel structure area 12 locates on the other side.

In the present preferred embodiment, when the array substrate is utilized, the pixel structures in the sub-areas 111 and 121 are distributed based on density. The amount of pixels in the sub-areas is more in zones near a junction between two pixel structure areas, and less in zones away from the junction. The sub-areas 111 and 121, closer to the junction, have more pixels. The sub-areas 111 and 121, farther from the junction, have less pixels. It can better improve the poorer brightness in zones closer to junctions of two pixel structure areas, and enhance the overall brightness uniformity of the pixel structure areas 11 and 12.

The present preferred embodiment is explained by two pixel structure areas. The array substrate has multiple pixel structure areas. Even if the pixel structures on the surface of the array substrate is formed by multiple lenses, the distribution of pixel structures in zones next to junctions of neighboring pixel structure areas also follows the above-mentioned method.

Preferably, pixel structures in the sub-areas next to junctions of neighboring pixel structure areas of the array substrate of the present preferred embodiment comprises pixel electrodes that have various line widths and/or deformed pixel electrodes.

Figure 2A:
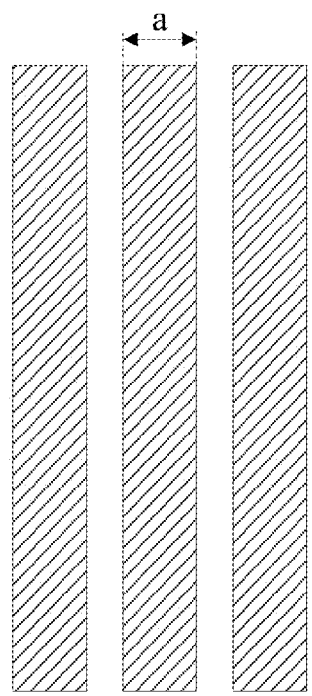
FIG. 2A shows one example of the pixel electrode diagrams of the array substrate according to the first preferred embodiment of the present invention.

Please refer to FIG. 2A showing one example of the pixel electrode diagrams of the array substrate according to the first preferred embodiment of the present invention. A line width a of the pixel electrode can be adjusted according to the brightness of the corresponding display area of a pixel structure sub-area. The wider the line width, the brighter the display area is; the narrower the line width, the darker the display area is.

Figure 2B:
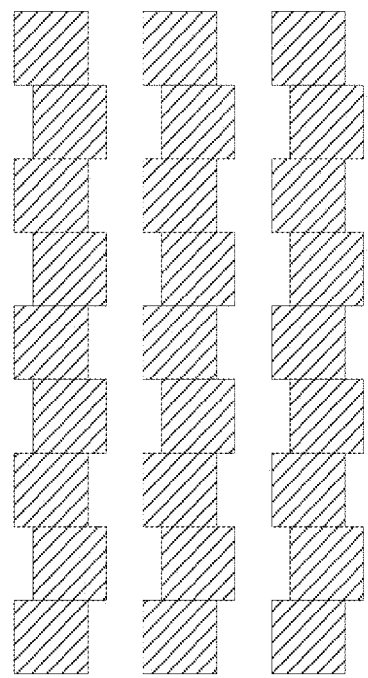
FIG. 2B shows another example of the pixel electrode diagrams of the array substrate according to the first preferred embodiment of the present invention.

Please refer to FIG. 2B showing another example of the pixel electrode diagrams of the array substrate according to the first preferred embodiment of the present invention. A deformed pixel electrode, showed in FIG. 2B, comprises bulges and dents. The deformed pixel electrode can improve the uneven brightness caused by intervals between pixel electrodes, and enhance the brightness uniformity of the corresponding display area.

Figure 2C:
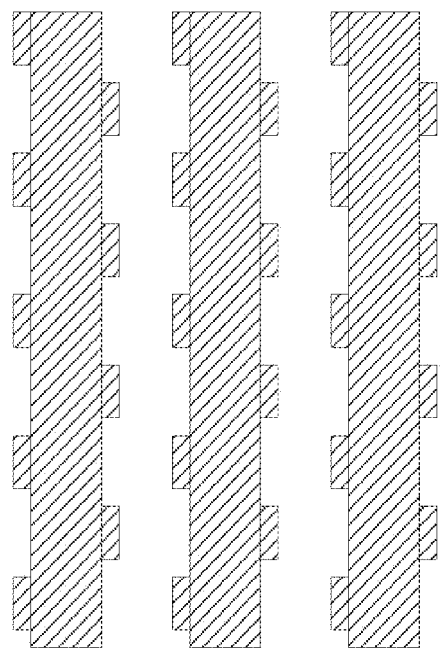
FIG. 2C shows still another example of the pixel electrode diagrams of the array substrate according to the first preferred embodiment of the present invention.

Please refer to FIG. 2C showing still another example of the pixel electrode diagrams of the array substrate according to the first preferred embodiment of the present invention. A deformed pixel electrode, showed in FIG. 2C, comprises bulges. The deformed pixel electrode can improve the uneven brightness caused by intervals between pixel electrodes, and enhance the brightness uniformity of the corresponding display area.

Figure 2D:
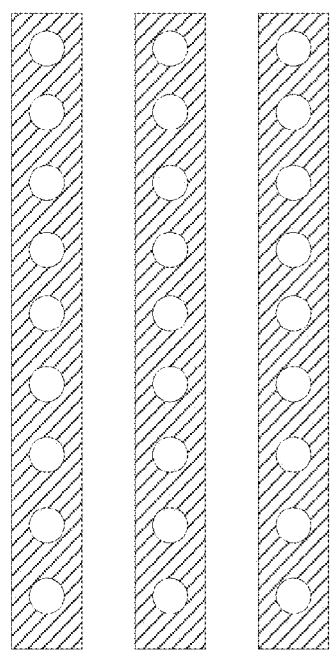
FIG. 2D shows yet another example of the pixel electrode diagrams of the array substrate according to the first preferred embodiment of the present invention.

Please refer to FIG. 2D showing yet another example of the pixel electrode diagrams of the array substrate according to the first preferred embodiment of the present invention. A deformed pixel electrode, showed in FIG. 2D, comprises openings. The deformed pixel electrode can improve the uneven brightness caused by intervals between pixel electrodes, and enhance the brightness uniformity of the corresponding display area.

The sub-areas can utilize pixel electrodes of various line widths and various deformed pixel electrodes as mentioned above, the present invention is able to adjust the brightness of a corresponding display area of a pixel structure sub-area, and further enhance the brightness uniformity of the corresponding LCD panel.

Therefore, the present preferred embodiment is an array substrate that distributes pixel structures in the sub-areas next to the junctions of neighboring pixel structure areas based on density, so that the brightness of sub-areas next to the junctions of neighboring pixel structure areas is in uniformity.

Figure 3:
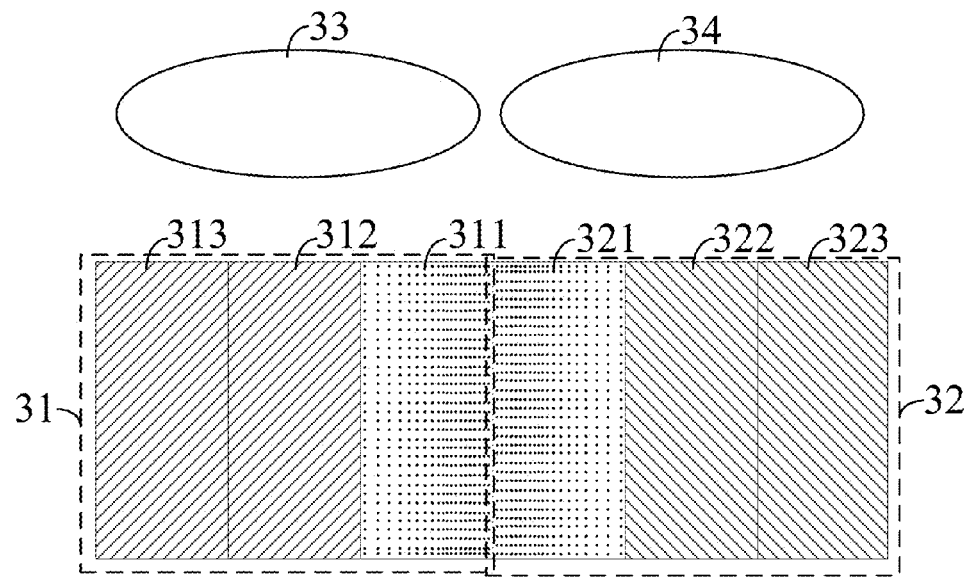
FIG. 3 shows a pixel structure diagram of an array substrate according to a second referred embodiment of the present invention.

Please refer to FIG. 3, the pixel structure diagram of the array substrate according to a second preferred embodiment of the present invention. The array substrate of the preferred embodiment comprises a plurality of data lines, a plurality of scan lines and a plurality of pixel structures with a plurality of pixel electrodes formed by the crossed data lines and scan lines. The array substrate comprises two or more pixel structure areas formed by different lenses, and each pixel structure area comprises a plurality of sub-areas, each having a plurality of pixel structures. The pixel structures in the sub-areas next to the junction of two pixel areas are distributed based on density, which means that the amount of pixel structures is more in zones near the junction, and less in zones away from the junction.

Please refer to FIG. 3. The array substrate in FIG. 3 comprises a pixel structure area 31 and a pixel structure area 32. The pixel structure area 31 comprises a sub-area 311, a sub-area 312, and a sub-area 313. The pixel structure area 32 comprises a sub-area 321, a sub-area 322, and a sub-area 323. The pixel structure area 31 is patterned through lens 33 and forms the pixel structures on the surface. Pixel structure area 32 is patterned through lens 34 and forms the pixel structures on the surface. The sub-area 311 of the pixel structure area 31 locates on one side of the junction between the pixel structure areas 31 and 32, and the sub-area 321 of the pixel structure area 32 locates on the other side.

Based on the first preferred embodiment, the array substrate in the present embodiment has pixel structures with multiple display domains. The pixel electrodes on each display domain extend to different directions.

In the present preferred embodiment, when the array substrate is utilized, the pixel structures in the sub-areas 311 and 321 are distributed based on density. The amount of pixels is more in zones near the junction between two pixel structure areas, and less in zones away from the junction. Sub-area 311 and 321, closer to the junction, have more pixels. Sub-areas 311 and 321, farther from the junction, have less pixels. It can better improve the poorer brightness in zones next to junctions of two pixel structure areas, and enhance the overall brightness uniformity of pixel structure areas 31 and 32.

The present preferred embodiment is explained by two pixel structure areas. The array substrate has multiple pixel structure areas. Even if the pixel structures on the surface of the array substrate is formed by multiple lenses, the distribution of pixel structures in zones next to junctions of neighboring pixel structure areas also follows the above-mentioned method.

The design of pixel structures of a plurality of display domains can further expand the viewing angle of the corresponding LCD panel.

Preferably, pixel structures in the sub-areas next to the junctions of neighboring pixel structure areas of the array substrate of the present preferred embodiment comprises pixel electrodes that have various line widths and/or various deformed pixel electrodes.

Figure 4A:
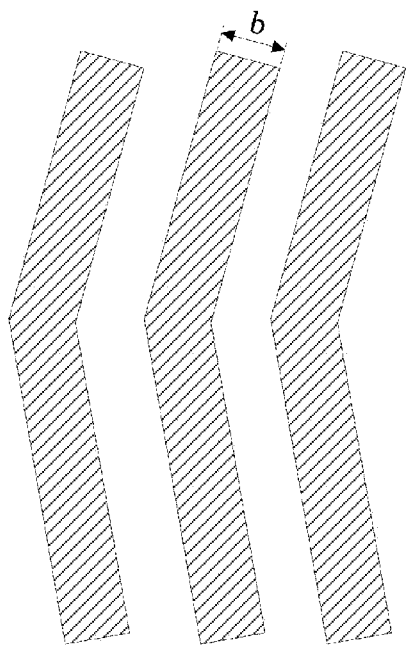
FIG. 4A shows one example of the pixel electrode diagrams of the array substrate according to the second preferred embodiment of the present invention.

Please refer to FIG. 4A showing one example of the pixel electrode diagrams of the array substrate according to the second preferred embodiment of the present invention. A line width b of the pixel electrode can be adjusted according to the brightness of the corresponding display area of a pixel structure sub-area. The wider the line width, the brighter the display area is; the narrower the line width, the darker the display area is.

Figure 4B:
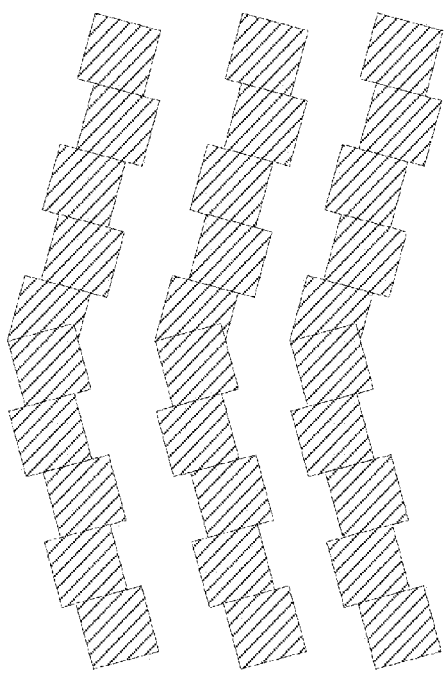
FIG. 4B shows another example of the pixel electrode diagrams of the array substrate according to the second preferred embodiment of the present invention.

Please refer to FIG. 4B showing another example of the pixel electrode diagrams of the array substrate according to the second preferred embodiment of the present invention. A deformed pixel electrode, showed in FIG. 4B, comprises bulges and dents. The deformed pixel electrode can improve the uneven brightness caused by intervals between pixel electrodes, and enhance the brightness uniformity of the corresponding display area.

Figure 4C:
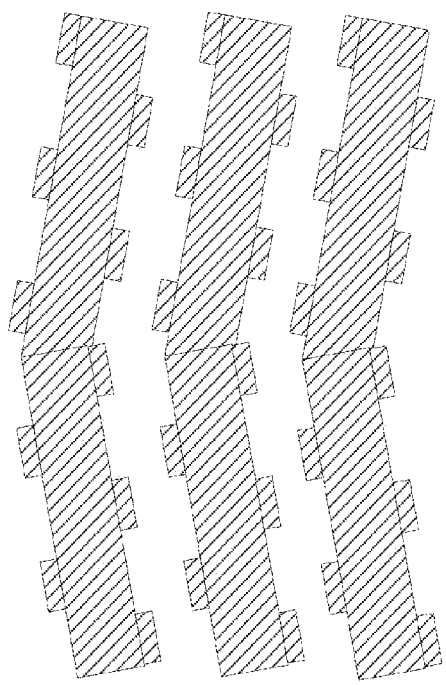
FIG. 4C shows still another example of the pixel electrode diagrams of the array substrate according to the second preferred embodiment of the present invention.

Please refer to FIG. 4C showing still another example of the pixel electrode diagrams of the array substrate according to the second preferred embodiment of the present invention. A deformed pixel electrode, showed in FIG. 4C, comprises bulges. The deformed pixel electrode can improve the uneven brightness caused by intervals between pixel electrodes, and enhance the brightness uniformity of the corresponding display area.

Figure 4D:
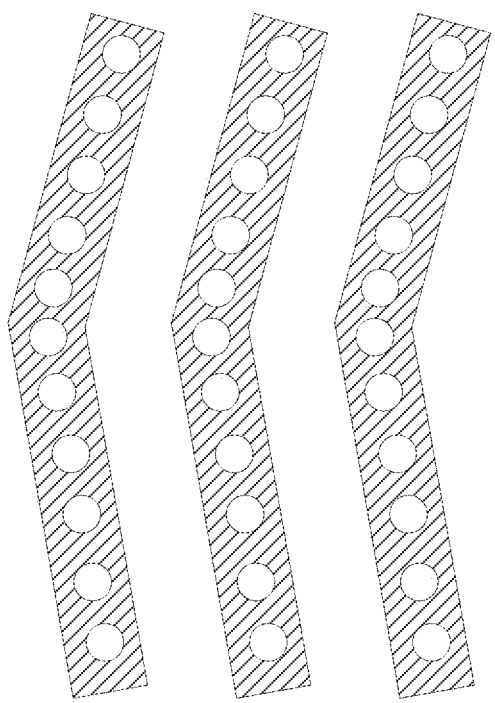
FIG. 4D shows yet another example of the pixel electrode diagrams of the array substrate according to the second preferred embodiment of the present invention.

Please refer to FIG. 4D showing yet another example of the pixel electrode diagrams of the array substrate according to the second preferred embodiment of the present invention. A deformed pixel electrode, showed in FIG. 4D, comprises openings. The deformed pixel electrode can improve the uneven brightness caused by intervals between pixel electrodes, and enhance the brightness uniformity of the corresponding display area.

The sub-areas can utilize pixel electrodes of various line widths and various deformed pixel electrodes as mentioned above, the present invention is able to adjust the brightness of a corresponding display area of a pixel structure sub-area, and further enhance the brightness uniformity of the corresponding LCD panel.

Therefore, the array substrate in the present preferred embodiment, based on the first preferred embodiment, is installed with pixel structures of display domains, and further expands the viewing angle of the corresponding LCD panel.

The present invention proposes a liquid crystal display panel. The liquid crystal display panel comprises an array substrate, a cell substrate, and a liquid crystal layer therebetween. The array substrate comprises a plurality of data lines, a plurality of scan lines and a plurality of pixel structures with pixel electrodes. The plurality of pixel structures are formed in areas surrounded by the plurality of date lines and the plurality of scan lines. The array substrate comprises two or more pixel structure areas formed by different lenses, with each pixel structure area comprising a plurality of sub-areas, and each sub-area comprising a plurality of pixel structures. The plurality of pixel structures in the plurality of sub-areas next to a junction of two pixel structure areas are distributed based on density. An amount of pixel structures is more in zones close to the junction, and less in zones away from the junction.

Preferably, the pixel structures in the sub-areas next to the junction of the two pixel structure areas comprise pixel electrodes of various line widths and/or deformed pixel electrodes. The deformed pixel electrodes comprise pixel electrodes having bulges or pixel electrodes having dents and bulges, or pixel electrodes having openings.

Preferably, the pixel structures comprises a plurality of display domains, with the pixel electrodes of each domain extending towards different directions.

Specific operation principles of LCD panels of the present invention are the same or similar to that of the array substrate described in the abovementioned preferred embodiments. Please refer to the description related to the array substrate in the abovementioned preferred embodiments for more specific explanation.

The array substrate and LCD panel in the present invention distributes pixel structures next to the junction of two pixel structure areas based on density. Thus the brightness of sub-areas next to the junction can be displayed in uniformity, solving the technical problem of poorer brightness uniformity of pixels at the edge of lenses of LCD panels.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An array substrate comprising a plurality of data lines, a plurality of scan lines and a plurality of pixel structures with pixel electrodes, the plurality of pixel structure being formed in areas surrounded by the plurality of date lines and the plurality of scan lines;

wherein the array substrate comprises two or more pixel structure areas formed by different lenses, with each pixel structure area comprising a plurality of sub-areas, and each sub-area comprising a plurality of pixel structures;

the plurality of pixel structures in the plurality of sub-areas next to a junction of two pixel structure areas are distributed based on density;

wherein an amount of pixel structures is more in zones close to the junction, and less in zones away from the junction;

wherein the pixel structures in the sub-areas next to the junction of the two pixel structure areas comprise pixel electrodes of various line widths;

wherein the pixel structures have a plurality of display domains, with the pixel electrodes of each domain extending towards different directions.

2. The array substrate of claim 1, wherein the pixel structures in the sub-areas next to the junction of two pixel structure areas further comprise deformed pixel electrodes.

3. The array substrate of claim 2, wherein the deformed pixel electrodes comprise pixel electrodes having bulges.

4. The array substrate of claim 2, wherein the deformed pixel electrodes comprise pixel electrodes having dents and bulges.

5. The array substrate of claim 2, wherein the deformed pixel electrodes comprise pixel electrodes having openings.

6. An array substrate comprising a plurality of data lines, a plurality of scan lines and a plurality of pixel structures with pixel electrodes, the plurality of pixel structure being formed in areas surrounded by the plurality of date lines and the plurality of scan lines;

wherein the array substrate comprises two or more pixel structure areas formed by different lenses, with each pixel structure area comprising a plurality of sub-areas, and each sub-area comprising a plurality of pixel structures;

the plurality of pixel structures in the plurality of sub-areas next to a junction of two pixel structure areas are distributed based on density;

wherein an amount of pixel structures is more in zones close to the junction, and less in zones away from the junction.

7. The array substrate of claim 6, wherein the pixel structures in the sub-areas next to the junction of the two pixel structure areas comprise pixel electrodes of various line widths.

8. The array substrate of claim 6, wherein the pixel structures in the sub-areas next to the junction of two pixel structure areas further comprise deformed pixel electrodes.

9. The array substrate of claim 8, wherein the deformed pixel electrodes comprise pixel electrodes having bulges.

10. The array substrate of claim 8, wherein the deformed pixel electrodes comprise pixel electrodes having dents and bulges.

11. The array substrate of claim 8, wherein the deformed pixel electrodes comprise pixel electrodes having openings.

12. The array substrate of claim 6, wherein the pixel structures comprises a plurality of display domains, with the pixel electrodes of each domain extending towards different directions.

13. A liquid crystal display panel, comprising an array substrate, a cell substrate, and a liquid crystal layer therebetween, the array substrate comprising a plurality of data lines, a plurality of scan lines and a plurality of pixel structures with pixel electrodes, the plurality of pixel structure being formed in areas surrounded by the plurality of date lines and the plurality of scan lines;

wherein the array substrate comprises two or more pixel structure areas formed by different lenses, with each pixel structure area comprising a plurality of sub-areas, and each sub-area comprising a plurality of pixel structures;

the plurality of pixel structures in the plurality of sub-areas next to a junction of two pixel structure areas are distributed based on density;

wherein an amount of pixel structures is more in zones close to the junction, and less in zones away from the junction.

14. The liquid crystal display panel of claim 13, wherein the pixel structures in the sub-areas next to the junction of the two pixel structure areas comprise pixel electrodes of various line widths.

15. The liquid crystal display panel of claim 13, wherein the pixel structures in the sub-areas next to the junction of two pixel structure areas further comprise deformed pixel electrodes.

16. The liquid crystal display panel of claim 15, wherein the deformed pixel electrodes comprise pixel electrodes having bulges.

17. The liquid crystal display panel of claim 15, wherein the deformed pixel electrodes comprise pixel electrodes having dents and bulges.

18. The liquid crystal display panel of claim 15, wherein the deformed pixel electrodes comprise pixel electrodes having openings.

19. The liquid crystal display panel of claim 13, wherein the pixel structures comprises a plurality of display domains, with the pixel electrodes of each domain extending towards different directions.

* * * * *